United States Patent
Miyatake

(10) Patent No.: US 11,422,105 B2
(45) Date of Patent: Aug. 23, 2022

(54) HUMIDITY SENSOR

(71) Applicant: MINEBEA MITSUMI Inc., Nagano (JP)

(72) Inventor: Mami Miyatake, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 65 days.

(21) Appl. No.: 17/114,696

(22) Filed: Dec. 8, 2020

(65) Prior Publication Data

US 2021/0181136 A1    Jun. 17, 2021

(30) Foreign Application Priority Data

Dec. 11, 2019    (JP) .............................. JP2019-223485

(51) Int. Cl.
| | |
|---|---|
| *G01N 27/22* | (2006.01) |
| *H01L 23/00* | (2006.01) |
| *H01L 23/532* | (2006.01) |
| *H01L 23/522* | (2006.01) |

(52) U.S. Cl.
CPC ....... *G01N 27/223* (2013.01); *H01L 23/5222* (2013.01); *H01L 23/53295* (2013.01); *H01L 23/564* (2013.01)

(58) Field of Classification Search
CPC .............. G01N 27/223; H01L 23/5222; H01L 23/53295; H01L 23/564
See application file for complete search history.

(56) References Cited

U.S. PATENT DOCUMENTS

| | | | |
|---|---|---|---|
| 4,277,742 A * | 7/1981 | Kovac .................... | G01K 13/00 219/209 |
| 7,032,448 B2 * | 4/2006 | Hamamoto .......... | G01N 27/225 73/335.04 |
| 7,176,700 B2 | 2/2007 | Itakura et al. | |
| 2016/0003758 A1* | 1/2016 | Hong ................... | G01N 27/223 324/664 |

FOREIGN PATENT DOCUMENTS

JP      2006-234576      9/2006

* cited by examiner

*Primary Examiner* — Peniel M Gumedzoe
(74) *Attorney, Agent, or Firm* — IPUSA, PLLC

(57) ABSTRACT

A humidity sensor includes a semiconductor substrate, an insulating film, an interconnect layer formed above the semiconductor substrate via the insulating film, a protective film that covers the interconnect layer, a moisture sensitive film formed above the protective film, and a metal oxide film formed between the protective film and the moisture sensitive film.

6 Claims, 10 Drawing Sheets

HUMIDITY SENSOR

CROSS-REFERENCE TO RELATED APPLICATION

This application claims priority under 35 U.S.C. § 119 to Japanese Patent Application No. 2019-223485, filed Dec. 11, 2019, the contents of which are incorporated herein by reference in their entirety.

BACKGROUND

1. Field of the Invention

The present disclosure relates to a humidity sensor.

2. Description of the Related Art

Some humidity sensors are capacitance types in which a moisture sensitive film is used as a dielectric substance, and the moisture sensitive film is formed of a high polymer material of which a permittivity varies according to an amount of absorbed water. In such a capacitance type humidity sensor, the moisture sensitive film is disposed between electrodes, and humidity (relative humidity) is determined by measuring capacitance possessed between the electrodes.

In the humidity sensor, for example, an insulating protective film such as a silicon nitride film is formed above a semiconductor substrate. Further, a moisture sensitive film that has hygroscopic properties and is formed of a polyimide-based polymer is formed directly on the protective film (see, for example, Unexamined Japanese Patent Publication No. 2006-234576 hereinafter referred to as Patent document 1).

The present disclosure provides a humidity sensor that improves adhesion between a protective film and a moisture sensitive film.

SUMMARY

According to the present disclosure, a humidity sensor includes a semiconductor substrate, an insulating film, an interconnect layer formed above the semiconductor substrate via the insulating film, a protective film that covers the interconnect layer, a moisture sensitive film formed above the protective film, and a metal oxide film formed between the protective film and the moisture sensitive film.

DESCRIPTION OF THE EMBODIMENTS

According to the present disclosure described below, a humidity sensor that improves adhesion between a protective film and a moisture sensitive film can be provided.

One or more embodiments will be hereinafter described with reference to the drawings. In each figure, the same numerals denote the same components and duplicate description for the components may be omitted. Note that in the present disclosure, when humidity is simply referred to, it means relative humidity.

[Outline Configuration of Humidity Sensor]

Figure 1:
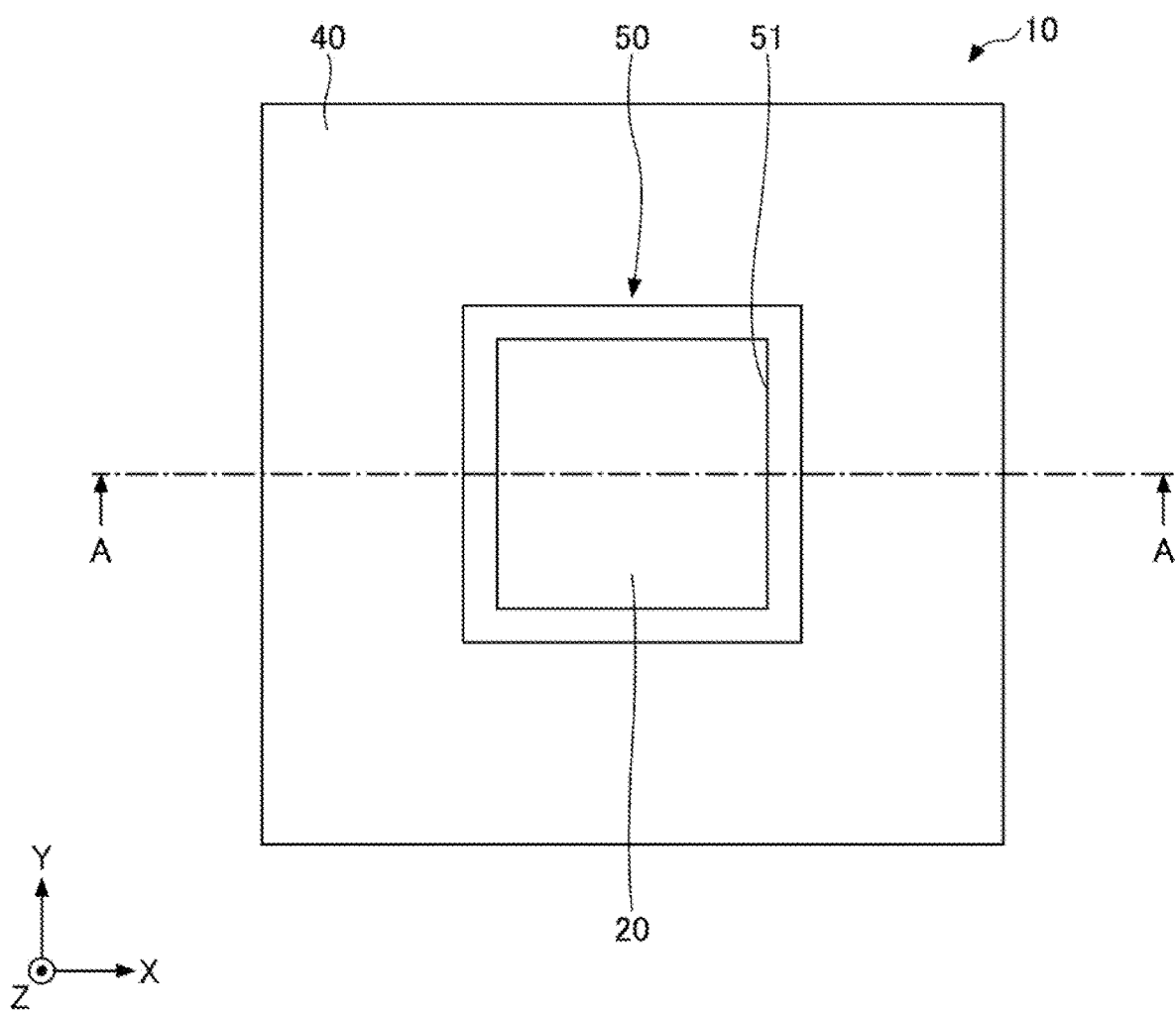
FIG. 1 is a plan view illustrating an example of a humidity sensor according to the present embodiment.
Figure 2:
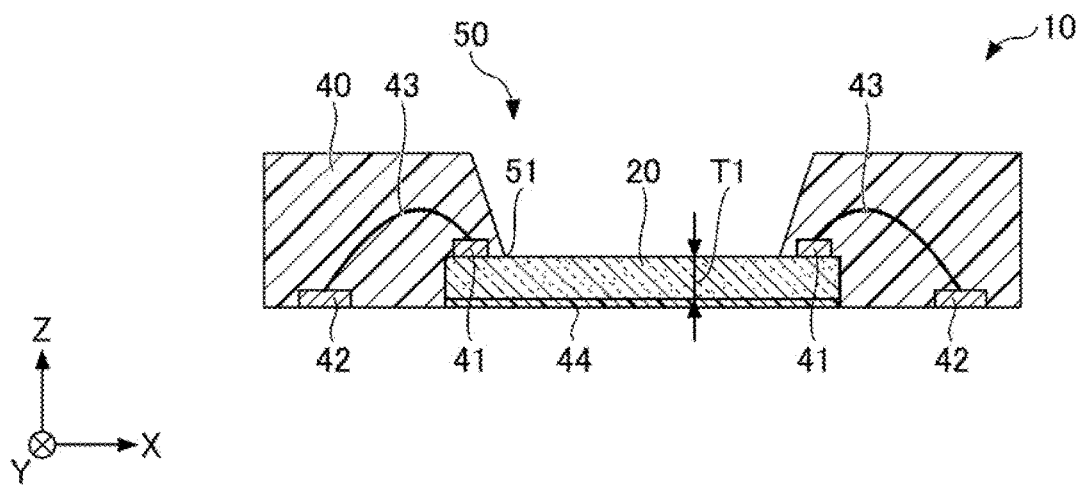
FIG. 2 is a cross-sectional view illustrating an example of the humidity sensor according to the present embodiment.

FIG. 1 is a plan view illustrating an example of a humidity sensor according to the present embodiment. FIG. 2 is a cross-sectional view illustrating an example of the humidity sensor according to the present embodiment. FIG. 2 is a cross-sectional view of the humidity sensor taken along the A-A line in FIG. 1.

Referring to FIGS. 1 and 2, the humidity sensor 10 has an approximately rectangular planar shape in which one pair among two opposite pairs of sides is parallel to the X direction and another is parallel to the Y direction. The X direction and Y direction are mutually perpendicular. The humidity sensor 10 also has a thickness in the Z direction perpendicular to the X direction and the Y direction. Note that the planar shape of the humidity sensor 10 is not limited to a rectangle and may be a circle, an ellipse, a polygon, or the like.

The humidity sensor 10 includes a sensor chip 20, mold resin 40, multiple pads 41, and multiple lead terminals 41. A given pad 41 and a given lead terminal 42 of the sensor chip 20 are electrically connected together via a given bonding wire 43.

The sensor chip 20, the pads 41, the lead terminals 42, and bonding wires 43 are sealed with, for example, the mold resin 40 to thereby be packaged. An insulating film 44 is formed on a lower surface of the sensor chip 20. The lead terminals 42 and the insulating film 44 are exposed at a lower surface of the humidity sensor 10.

The pads 41 are each formed of, for example, aluminum, an aluminum-silicon alloy (AlSi), or the like. The lead terminals 42 are each formed of, for example, nickel, copper, or the like. The bonding wires 43 are each formed of, for example, a gold wire, a copper wire, or the like. The insulating film 44 is formed of an insulating material consisting of a mixture such as a mixture of resin and silica. The mold resin 40 is a black resin with a light blocking effect, such as an epoxy resin containing a mixture including carbon black, silica, or the like.

An opening 50 for exposing a portion of the sensor chip 20 from the mold resin 40 is formed on an upper surface side of the humidity sensor 10. For example, a wall of the opening 50 is tapered and an opening area of the opening 50 is decreased toward the bottom. In the opening 50, a lowest opening that exposes the sensor chip 20 in actuality is referred to as an effective opening 51.

When the opening 50 is formed, the sensor chip 20 is sealed with the mold resin 40 while pressed by a mold. In this case, due to a force to press the sensor chip 20 by the mold, breakage such as chip crack may occur. In order to avoid such breakage, a thickness T1 of the sensor chip 20 is preferably greater than or equal to 200 μm.

Figure 3:
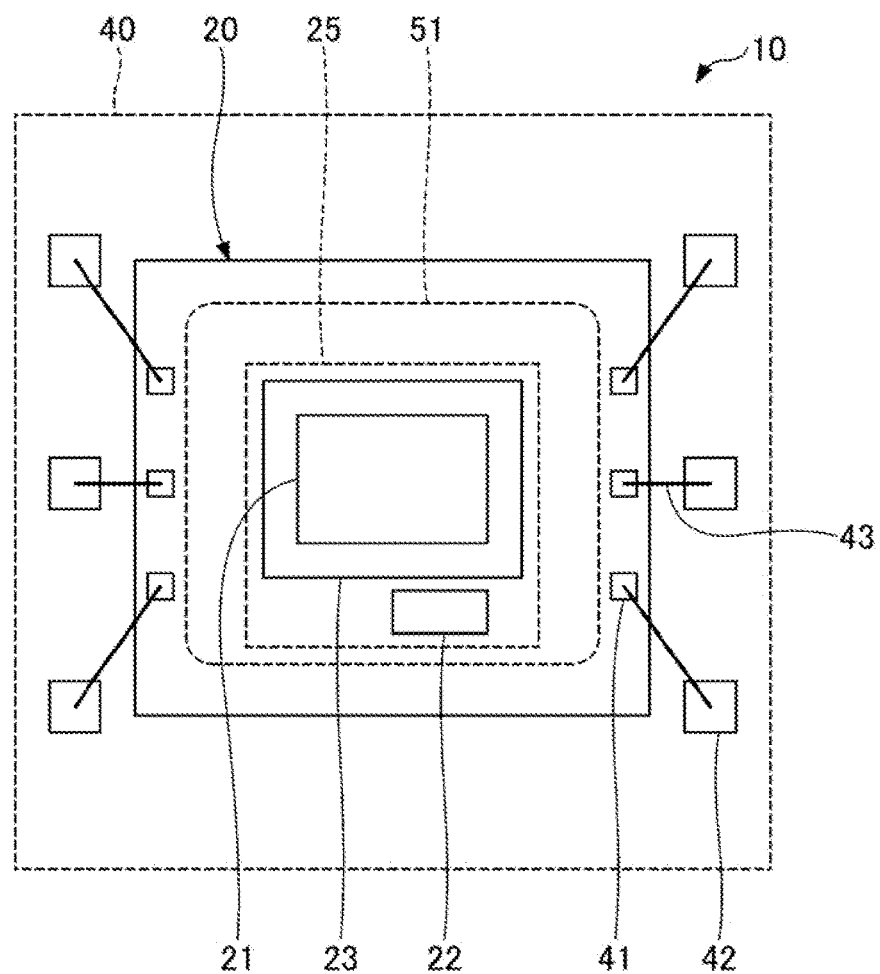
FIG. 3 is a plan view of an example of the humidity sensor from which mold resin is removed.

FIG. 3 is a plan view of an example of the humidity sensor from which the mold resin 40 is removed. For the sensor chip 20, a humidity detector 21, a temperature detector 22, and a heater 23 are provided in an area exposed by the effective opening 51.

The heater 23 is formed under the humidity detector 21 so as to cover a region where the humidity detector 21 is formed. In such a case, an area of the heater 23 is greater than an area of the humidity detector 21. With such a configuration, the sensor chip 20 and the like are sealed with the mold resin 40 as a sealing member, in a state in which the humidity detector 21 and the temperature detector 22 are exposed.

In the example in FIG. 3, six pads 41 are formed in the outer periphery of the sensor chip 20. Each pad 41 is connected to a given lead terminal 42 via a given bonding wire 43. For example, each lead terminal 42 is connected to a semiconductor chip for signal processing and control.

The numeral 25 illustrated in FIG. 3 represents an allowed formation region of the humidity detector 21 and the temperature detector 22 in the sensor chip 20. Even when displacement of the sensor chip 20 from the mold occurs at a greatest amount during manufacture, the allowed formation region 25 is set in a region where the opening 50 is formed, in order to ensure exposure of the humidity detector 21 and the temperature detector 22 from the opening 50. As long as the humidity detector 21 and the temperature detector 22 are disposed in the allowed formation region 25, they are surely exposed from the opening 50 even when the displacement described above occurs.

[Configuration of Sensor Chip]

Figure 4:
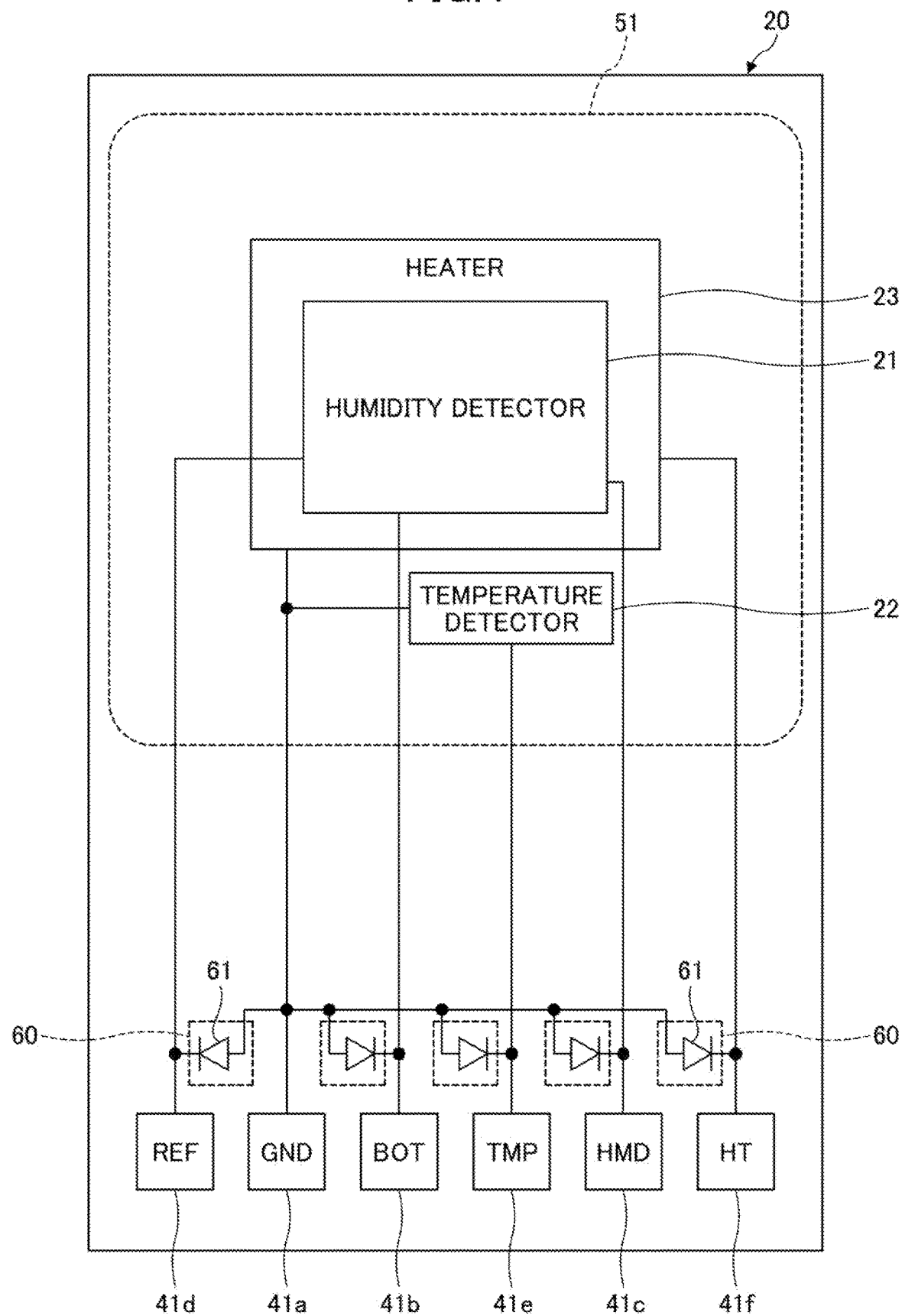
FIG. 4 is a schematic diagram illustrating an example of a sensor chip.

FIG. 4 is a schematic diagram illustrating an example of the configuration of the sensor chip. The above-mentioned pads 41 are terminals used when a voltage is externally applied or a potential is detected. In FIG. 4, the respective pads 41 illustrated in FIG. 3 are represented to be distinguished from pads 41a to 41f. Note that when the pads 41a and 41f are not distinguished from one another, they are simply referred to as pads 41.

A pad 41a serves as a ground electrode terminal (GND) that is grounded to a ground potential. The pad 41a is electrically connected to, for example, a semiconductor chip for signal processing and control, via one or more interconnect layers or a substrate.

A pad 41b is a lower electrode terminal (BOT) that is electrically connected to a lower electrode 83 (described below) of the humidity detector 21. The pad 41b is used to supply a drive voltage to the lower electrode 83. A pad 41c is a humidity detection terminal (HMD) that is electrically connected to an upper electrode 84 (described below) of the humidity detector 21. The pad 41c is used to obtain a detection signal indicating relative humidity via the upper electrode 84. A pad 41d is a reference electrode terminal (REF) that is electrically connected to a reference electrode 82 (described above) of the humidity detector 21. The pad 41d is used to obtain a reference signal for detecting humidity, via the reference electrode 82.

A pad 41e is a temperature detection terminal (TMP) that is electrically connected to the temperature detector 22. The pad 41e is used to obtain a detection signal indicating temperature. A pad 41f is a heater terminal (HT) that is electrically connected to the heater 23. The pad 41f is used to supply a drive voltage for driving the heater 23.

Electrostatic discharge (ESD) protection circuits 60 are respectively connected to the pads 41b to 41f other than the pad 41a. Each ESD protection circuit 60 is connected between the pad 41a as the ground electrode terminal and a given pad as an input terminal or an output terminal, among the pads 41b to 41f. In the present embodiment, each ESD protection circuit 60 includes one diode 61. An anode of the diode 61 is connected to the pad 41a, and a cathode is connected to a given pad among the pads 41b to 41f.

Each ESD protection circuit 60 is preferably disposed in proximity to a given pad among the pads 41b to 41f so as to be as far as possible away from the effective opening 51. Each ESD protection circuit 60 is sealed with the mold resin 40 and thus unwanted charge caused by a photoelectric effect is not generated.

[Configuration of ESD Protection Circuit]

Figure 5:
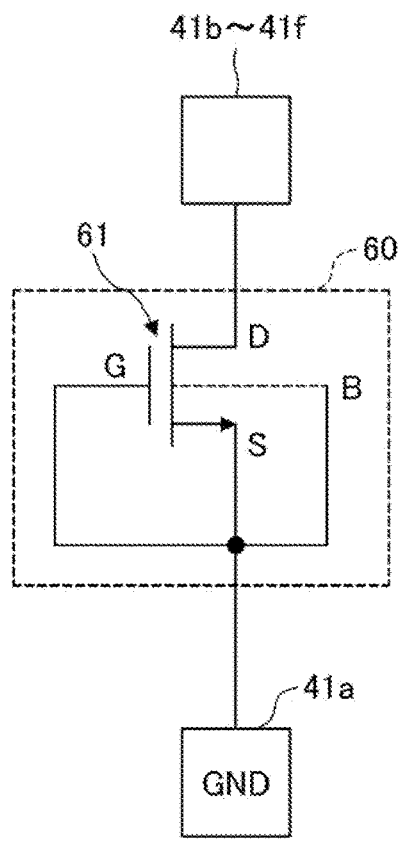
FIG. 5 is a circuit diagram illustrating an example of the configuration of an ESD protection circuit.

FIG. 5 is a circuit diagram illustrating an example of the configuration of the ESD protection circuit 60. As illustrated in FIG. 5, a diode 61 constituting the ESD protection circuit 60 is formed by, for example, an n-channel metal oxide semiconductor (MOS) transistor (hereinafter referred to as an NMOS transistor). Specifically, the diode 61 is a diode in which a source, a gate, and a back gate of the NMOS transistor is short-circuited (so-called diode connection). In such a configuration, a short circuit serves as an anode. A drain of the NMOS transistor serves as a cathode.

Figure 6:
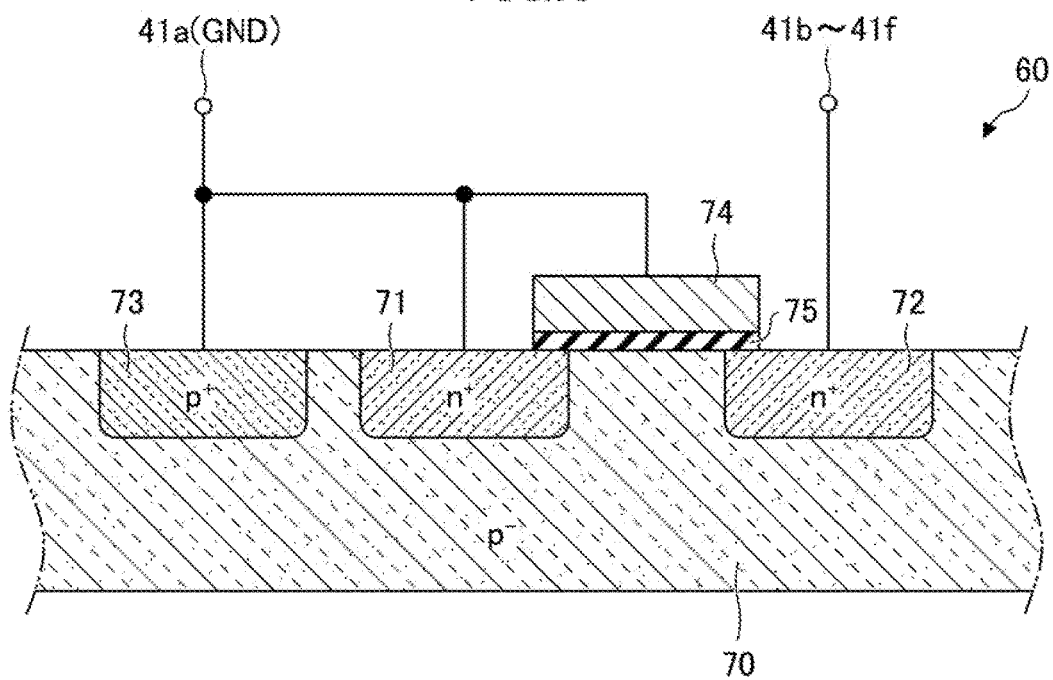
FIG. 6 is a diagram illustrating an example of a layer structure of an NMOS transistor that constitutes the ESD protection circuit.

FIG. 6 is a diagram illustrating an example of a layer structure of the NMOS transistor that constitutes the ESD protection circuit. The NMOS transistor includes two n-diffusion layers 71 and 72 that are formed in a surface layer of the p-semiconductor substrate 70 for constituting part of the sensor chip 20. The NMOS transistor also includes a contact layer 73 and a gate electrode 74. The gate electrode 74 is formed above a surface of the p-semiconductor substrate 70 via a gate insulating film 75. The gate electrode 74 is disposed with respect to the two n-diffusion layers 71 and 72.

For example, the n-diffusion layer 71 serves as a source and the n-diffusion layer 72 serves as a drain. The contact layer 73 is a low resistance layer (p-diffusion layer) for electrical connection with the p-semiconductor substrate 70 as a back gate. The n-diffusion layer 71, the gate electrode 74, and the contact layer 73 are commonly connected to be short-circuited. In such a configuration, a short circuit serves as an anode, and the n-diffusion layer 72 serves as a cathode.

The p-semiconductor substrate 70 is a p-silicon substrate, for example. The gate electrode 74 is formed of metal or polycrystalline silicon (polysilicon). For example, the gate insulating film 75 is formed by an oxide film such as silicon dioxide.

[Configuration of Humidity Detector]

Figure 7:
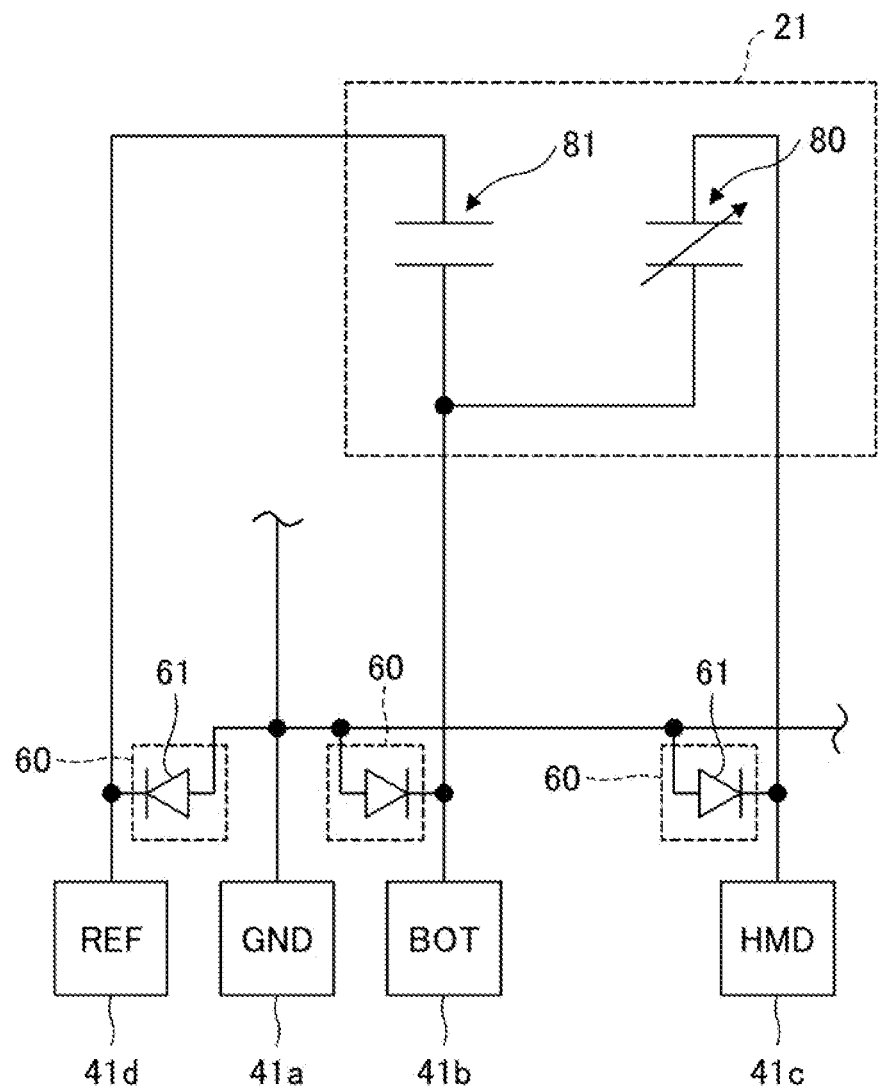
FIG. 7 is a circuit diagram illustrating an example of the configuration of a humidity detector.

FIG. 7 is a circuit diagram illustrating an example of the configuration of the humidity detector. As illustrated in FIG. 7, the humidity detector 21 includes a humidity detection capacitor 80 and a reference capacitor 81.

One electrode (lower electrode 83) of the humidity detector 21 is connected to the pad 41b as the lower electrode terminal. Another electrode (upper electrode 84) of the humidity detector 21 is connected to the pad 41c as the humidity detection terminal. One electrode of the reference capacitor 81 is common to the one electrode (lower electrode 83) of the humidity detector 21. Another electrode (reference electrode 82) of the reference capacitor 81 is connected to the pad 41*d* as the reference terminal.

In the humidity detection capacitor 80, a moisture sensitive film 86 described below is provided between the lower electrode 83 and the upper electrode 84. The moisture sensitive film 86 is formed of a high polymeric material such as polyimide that absorbs moisture in the air and of which a permittivity varies according to an amount of absorbed water. Accordingly, for the humidity detection capacitor 80, capacitance varies according to an amount of moisture that the moisture sensitive film 86 absorbs.

In the reference capacitor 81, a second insulating film 111 (see FIG. 9) described below is provided between the lower electrode 83 and the upper electrode 84. The second insulating film 111 is formed of an insulating material such as silicon dioxide ($SiO_2$) that does not absorb moisture. With such a configuration, for the reference capacitor 81, capacitance does not vary, or variation is negligible even when capacitance varies.

As described above, the humidity detection capacitor 80 is configured by the lower electrode 83 and the upper electrode 84, and the reference capacitor 81 is configured by the lower electrode 83 and the reference electrode 82.

An amount of moisture contained in the moisture sensitive film 86 varies depending on humidity in the surroundings of the humidity sensor 10. In such a case, relative humidity can be measured by detecting a difference between capacitance of the humidity detection capacitor 80 and capacitance of the reference capacitor 81. A semiconductor chip for signal processing and control measures the relative humidity based on a potential at the pad 41*c* as the humidity detection terminal and a potential at the pad 41*d* as the reference electrode terminal, where the semiconductor chip is electrically connected to given pads 41, for example.

[Configuration of Temperature Detector]

Figure 8:
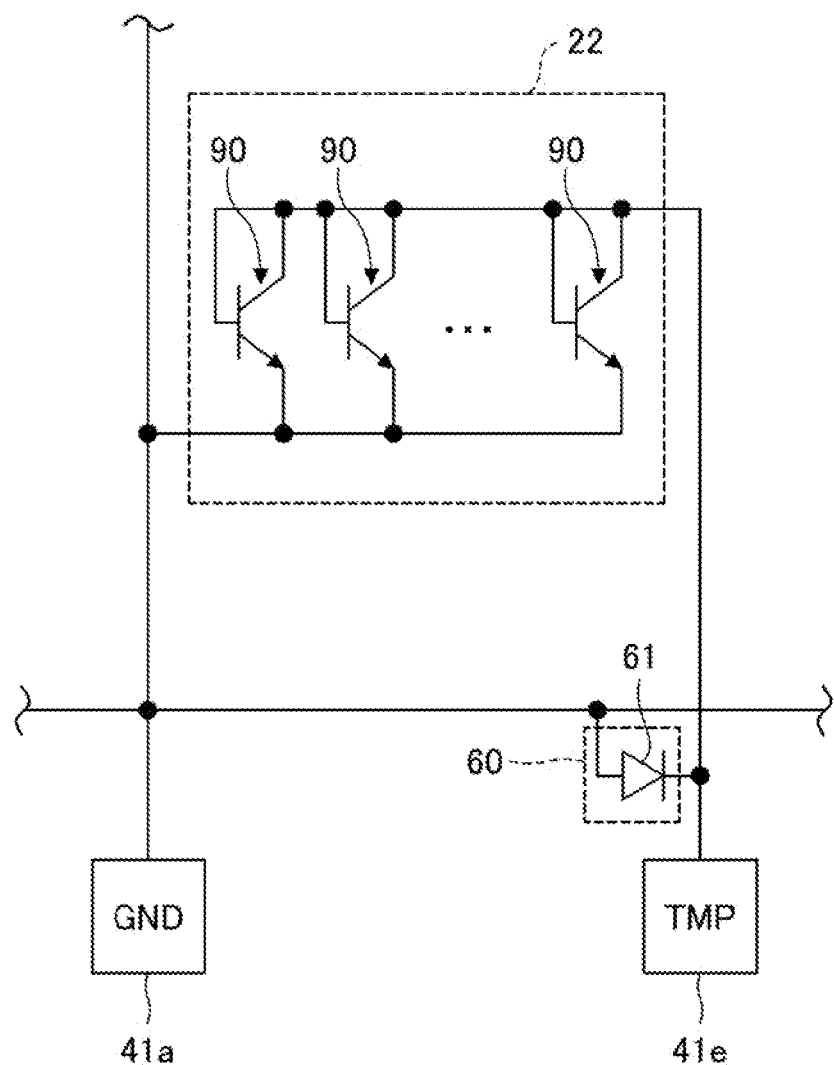
FIG. 8 is a circuit diagram illustrating an example of the configuration of a temperature detector.

FIG. 8 is a circuit diagram illustrating an example of the configuration of the temperature detector. The temperature detector 22 is a bandgap temperature sensor that detects temperature by use of a characteristic that is an electric characteristic varying proportionally depending on a change in temperature. For example, the temperature detector 22 includes one or more bipolar transistors in each of which any two among a base, an emitter, and a collector are connected together to thereby form two terminals. By detecting resistance between the two terminals, temperature can be measured.

As illustrated in FIG. 8, in the present embodiment, the temperature detector 22 includes a plurality of (e.g., eight) npn-bipolar transistors 90 connected in parallel, and the base of each bipolar transistor 90 is connected to the collector. In such a configuration, by connecting the plurality of bipolar transistors 90 in parallel, a junction area of a p-n junction is increased, thereby improving ESD resistance.

The emitter of each bipolar transistor 90 is connected to the pad 41*a* as the ground electrode terminal. The base and the collector of each bipolar transistor 90 are connected to the pad 41*e* as the temperature detection terminal.

For example, a semiconductor chip for signal processing and control that is electrically connected to given pads 41 measures temperature based on a potential at the pad 41*e*.

[Element Structure of Sensor Chip]

Figure 9:
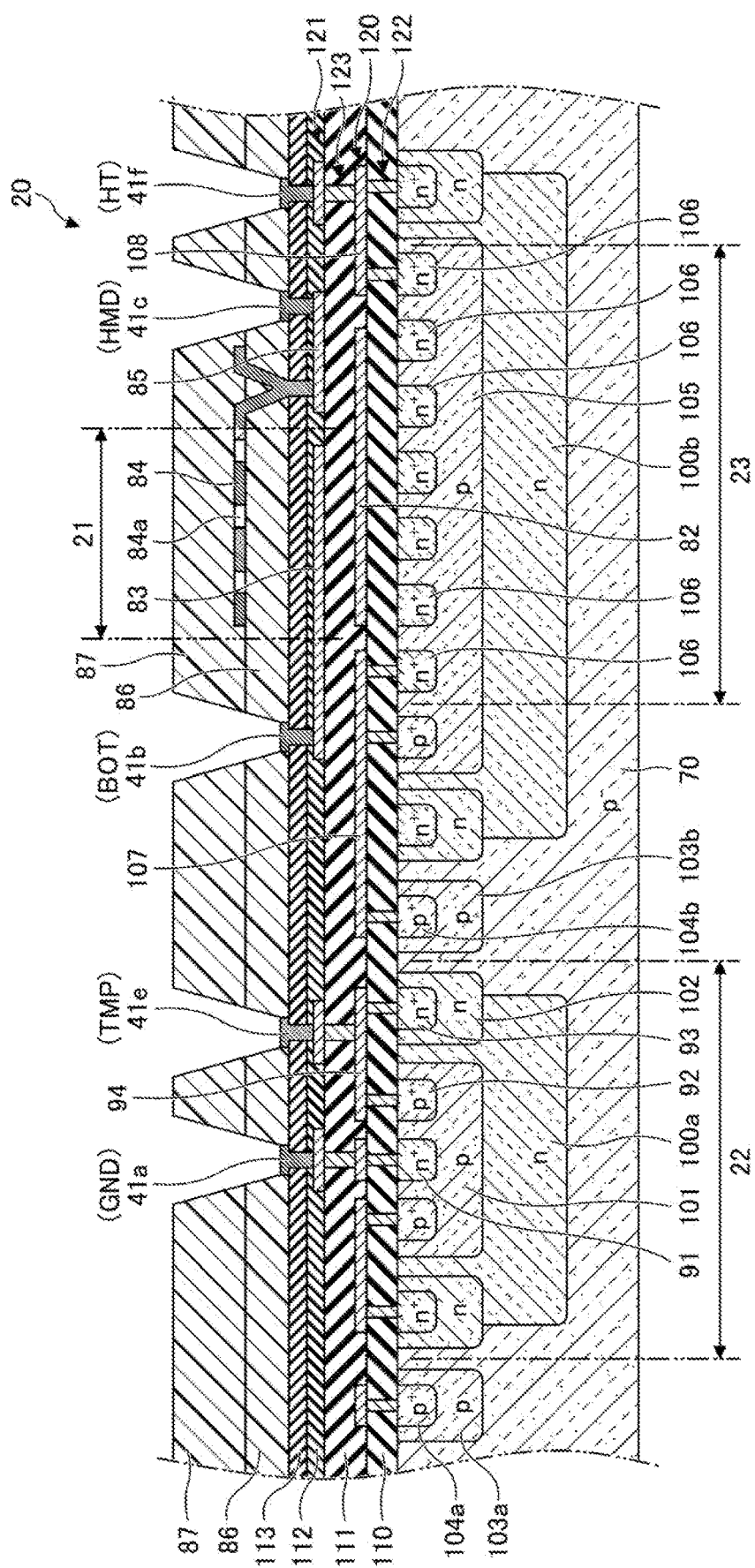
FIG. 9 is a cross-sectional view schematically illustrating an example of an element structure of the sensor chip.

FIG. 9 is a schematic cross-sectional view illustrating an example of an element structure of the sensor chip. Note that in FIG. 9, the pads 41*a*, 41*b*, 41*c*, 41*e*, and 41*f* are illustrated in the same cross section as the humidity detector 21, the temperature detector 22, and the heater 23, for purposes of facilitating understanding of the structure. This, however, does not mean that in actuality, the pads are present in the same cross section. Also, the cross section of each of the humidity detector 21, the temperature detector 22 and the heater 23 is simplified for purposes of facilitating understanding of the structure. Accordingly, a relationship such as a positional relationship with respect to the above components differs from an actual relationship.

As illustrated in FIG. 9, the sensor chip 20 is formed using the above-mentioned p-semiconductor substrate 70. In the p-semiconductor substrate 70, a first deep-n-well 100*a* and a second deep-n-well 100*b* are formed. The temperature detector 22 is formed in the first deep-n-well 100*a*. The heater 23 is formed in the second deep-n-well 100*b*.

In a surface layer of the p-semiconductor substrate 70 in which neither the first deep-n-well 100*a* nor the second deep-n-well 100*b* is formed, p-wells 103*a* and 103*b* are formed. In surface layers of the p-wells 103*a* and 103*b*, p-contact layers 104*a* and 104*b* each of which includes a given p-diffusion region are formed respectively. Each of the contact layers 104*a* and 104*b* is a low resistance layer (p-diffusion layer) for electrical connection between a predetermined interconnect layer formed above the p-semiconductor substrate 70 and the p-semiconductor substrate 70.

In a surface layer of the first deep-n-well 100*a*, a p-well 101 and an n-well 102 are formed. An n-diffusion layer 91 and a p-diffusion layer 92 are formed in a surface layer of the p-well 101. An n-diffusion layer 93 is formed in a surface layer of the n-well 102. The n-diffusion layer 91, the p-diffusion layer 92, and the n-diffusion layer 93 constitute the npn-bipolar transistor 90 described above, and serve as an emitter, a base, and a collector, respectively.

A p-well 105 is formed in a surface layer of the second deep-n-well 100*b*. One or more n-diffusion layers 106 may be formed in a surface layer of the p-well 105. In the present embodiment, multiple n-diffusion layers 106 are formed. For example, each n-diffusion layer 106 extends in a direction perpendicular to a plane of the paper, and the layers are wholly arranged in a one-dimensional grating pattern (see FIG. 11). Each n-diffusion layer 106 has a predetermined resistance value (e.g., a sheet resistance value of about $3\Omega$), and serves as a resistor that generates heat when a current flows. In other words, the n-diffusion layers 106 constitute the heater 23.

Each layer in the p-semiconductor substrate 70 is formed in a general semiconductor manufacturing process (CMOS process). In this case, each n-diffusion layer 106 as a resistor is formed in the same manufacturing process as the n-diffusion layers 91 and 93 partially included in the temperature detector 22. The n-diffusion layers 106, 91, and 93 are formed simultaneously in an ion-implantation process in which a substrate is doped with an impurity used in ion implantation of an n-impurity (e.g., phosphorus). In such a case, each n-diffusion layer 106 as a resistor has the same depth from the surface of the p-semiconductor substrate 70 as the n-diffusion layers 91 and 93 partially included in the temperature detector 22. Each n-diffusion layer 106 may have the same depth from the surface of the p-semiconductor substrate 70 as the p-diffusion layer 92 partially included in the temperature detector 22.

Note that the n-diffusion layers 106, 91, and 93 may be formed in a thermal diffusion process in which an impurity is added by heat treatment, instead of the ion implantation process.

The above n-diffusion layers 71 and 72 in each ESD protection circuit 60 are also formed in the same manufacturing process (ion implantation process or thermal diffusion process) as the n-diffusion layers 106, 91, and 93. The contact layer 73 is formed in the same manufacturing process (ion implantation process or thermal diffusion process) as the p-diffusion layer 92, the contact layers 104a and 104b, and the like.

Other layers in the p-semiconductor substrate 70 mainly serve as contact layers, and description for these layers will be omitted.

A first insulating film 110, a second insulating film 111, a third insulating film 112, and a metal oxide film 113 are sequentially laminated on or above the surface of the p-semiconductor substrate 70. The first insulating film 110, the second insulating film 111, and the third insulating film 112 are each formed of, for example, an insulating material such as silicon dioxide ($SiO_2$) or silicon nitride (SiN). The third insulating film 112 is a protective film that protects the lower electrode 83 and the like. The third insulating film 112 is provided for preventing oxidation, corrosion, and the like of a second interconnect layer 121 including the lower electrode 83.

The metal oxide film 113 is formed between the third insulating film 112 and the moisture sensitive film 86. In other words, the lower surface of the metal oxide film 113 is in contact with the upper surface of the third insulating film 112, and the upper surface of the metal oxide film 113 is in contact with the lower surface of the moisture sensitive film 86.

The metal oxide film 113 is an adhesive layer having a function of improving adhesion between the third insulating film 112 and the moisture sensitive film 86. The metal oxide film 113 is formed of, for example, alumina ($Al_2O_3$). For example, the metal oxide film 113 can be formed by dry deposition such as sputtering or atomic layer deposition (ALD), wet deposition using a chelating agent or the like.

For example, the thickness of the metal oxide film 113 is approximately between 1 nm and 100 nm. When the thickness of the metal oxide film 113 is greater than or equal to 1 nm, formation of an area where the metal oxide film 113 is not formed on the upper surface of the third insulating film 112 can be prevented. Further, when the thickness of the metal oxide film 113 is less than or equal to 100 nm, a film can be easily deposited by the methods described above. Further, the effect of stress generated due to an increased film thickness can be minimized. Capacitance obtained associated with the metal oxide film 113 can be also minimized.

A first interconnect layer 120 is formed on the first insulating film 110. The second interconnect layer 121 is formed on the second insulating film 111. The first interconnect layer 120 is overlaid with the second insulating film 111. The second interconnect layer 121 is overlaid with the third insulating film 112. The first interconnect layer 120 and the second interconnect layer 121 are each formed of a conductive material such as aluminum.

A first plug layer 122 with multiple first plugs for connecting the first interconnect layer 120 to the p-semiconductor substrate 70 is formed in the first insulating film 110. A second plug layer 123 with multiple second plugs for connecting the first interconnect layer 120 to the second interconnect layer 121 is formed in the second insulating film 111. The first plug layer 122 and the second plug layer 123 are each formed of a conductive material such as tungsten.

For example, an interconnect 94 for connecting the base of each bipolar transistor 90 to a corresponding collector is formed by the first interconnect layer 120. The interconnect 94 is connected to each of the p-diffusion layer 92 and the n-diffusion layer 93, via the first plug layer 122. The interconnect 94 is also connected to the pad 41e as the temperature detection terminal via the second plug layer 123 and the second interconnect layer 121. The n-diffusion layer 91 as the emitter of each bipolar transistor 90 is connected to the pad 41a as the ground electrode terminal via the first plug layer 122, the first interconnect layer 120, and the second interconnect layer 121.

An interconnect 107 for grounding one end of the heater 23 to a ground potential is formed by the first interconnect layer 120, and is connected to each of a given n-diffusion layer 106 and the contact layer 104b via the first plug layer 122. An interconnect 108 for connecting another end of the heater 23 to the pad 41f as the heater terminal is connected to a given n-diffusion layer 106 via the first plug layer 122, and is connected to the pad 41f via the second plug layer 123 and the second interconnect layer 121.

The reference electrode 82 of the reference capacitor 81 is formed by the first interconnect layer 120, and is connected to the pad 41d (not illustrated in FIG. 9) as the reference electrode terminal, via the second plug layer 123 and the second interconnect layer 121.

The lower electrode 83 of the humidity detection capacitor 80 is formed by the second interconnect layer 121, and is connected to the pad 41b as the lower electrode terminal. Further, an interconnect 85 for connecting the upper electrode 84 of the humidity detection capacitor 80 to the pad 41c as the humidity detection terminal is formed by the second interconnect layer 121. Note that the lower electrode 83 is disposed at a location opposite the reference electrode 82, via the second insulating film 111.

Each of the pads 41a to 41f is formed of a conductive material such as aluminum, and is disposed on the third insulating film 112. Each of the pads 41a to 41f passes through the third insulating film 112 to be connected to the second interconnect layer 121.

The moisture sensitive film 86 is formed above the third insulating film 112, via the metal oxide film 113. The moisture sensitive film 86 has a thickness between 0.5 μm and 1.5 μm, and is formed of a polymeric material capable of easily absorbing and desorbing water molecules in accordance with humidity. The moisture sensitive film 86 is a polyimide film having a thickness of 1 μm, for example. Note that a polymeric material forming the moisture sensitive film 86 is not limited to polyimide, and may include cellulose, polymethyl methacrylate (PMMA), polyvinyl alcohol (PVA), or the like.

The upper surface of the moisture sensitive film 86 is flat, and a flat-plate upper electrode 84 is formed on the upper surface of the moisture sensitive film 86. The upper electrode 84 is formed at a location opposite the lower electrode 83, via the moisture sensitive film 86. A portion of the upper electrode 84 is connected to the interconnect 85. The upper electrode 84 is a conductive film that is formed of aluminum metal or the like that has a thickness of, for example, 200 nm. A plurality of openings 84a are formed in the upper electrode 84 in order to efficiently incorporate water molecules in the air into the moisture sensitive film 86.

An overcoat film 87 is disposed on the moisture sensitive film 86 so as to cover the upper electrode 84. The overcoat film 87 is formed of a polymeric material, e.g., the same material as the moisture sensitive film 86. The overcoat film 87 has a thickness between 0.5 μm and 10 μm, for example.

Openings for exposing the pads 41a to 41f are formed in the moisture sensitive film 86 and the overcoat film 87.

As described above, the parallel-plate humidity detection capacitor 80 is configured by the lower electrode 83 and the upper electrode 84. Also, the parallel-plate reference capacitor 81 is configured by the lower electrode 83 and the reference electrode 82. The humidity detection capacitor 80 and the reference capacitor 81 are disposed above the heater 23.

With such a configuration, when the heater 23 produces heat, the moisture sensitive film 86 between the lower electrode 83 and the upper electrode 84 is heated. In such a case, temperature is increased due to heating and thereby the moisture sensitive film 86 adsorbs an amount of water molecules in accordance with humidity. Accordingly, the permittivity of the moisture sensitive film 86 changes and capacitance of the humidity detection capacitor 80 is thereby decreased. Further, the temperature detector 22 detects increased temperature caused by the heater 23.

Figure 10:
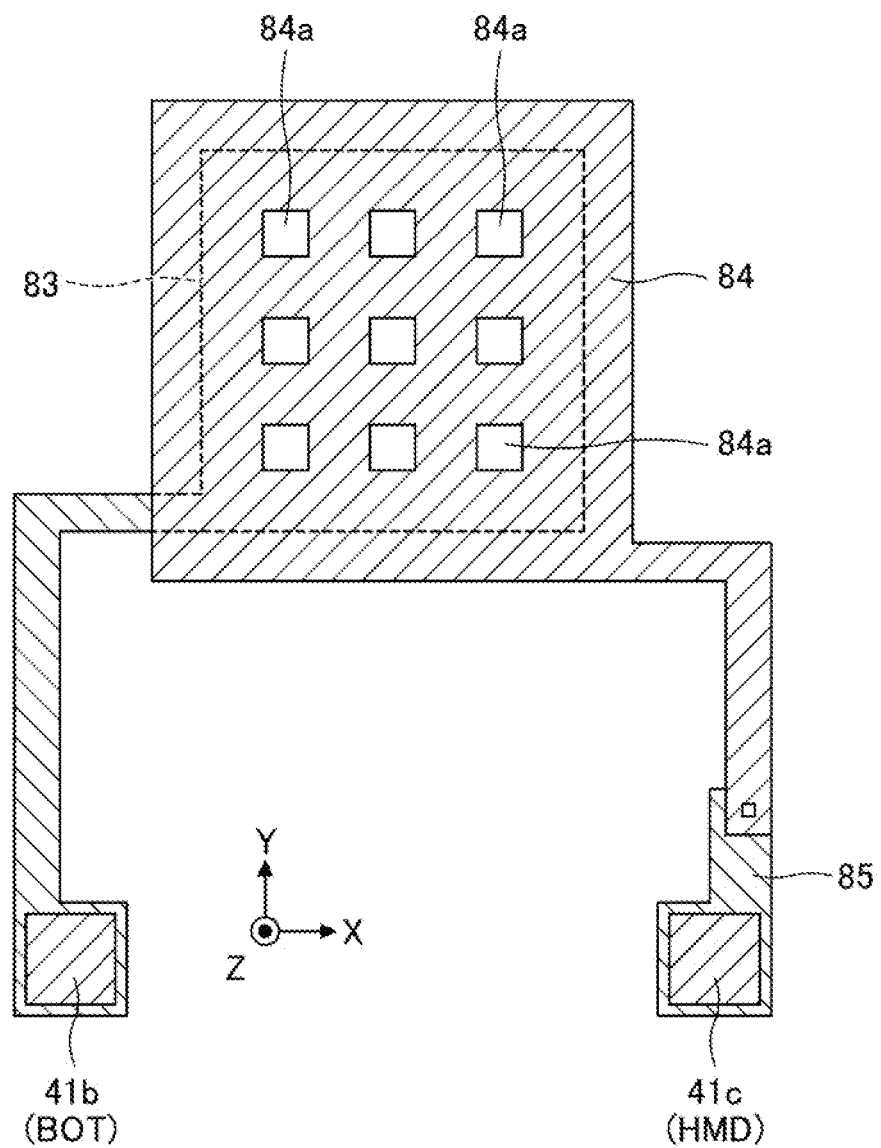
FIG. 10 is a plan view illustrating an example of the shape of a lower electrode and an upper electrode.

FIG. 10 is a plan view illustrating an example of the shape of the lower electrode and the upper electrode. As illustrated in FIG. 10, each of the lower electrode 83 and the upper electrode 84 has a rectangular shape. The upper electrode 84 is formed so as to cover the lower electrode 83.

One or more openings 84a are preferably as small as possible. Leakage of an electric field in the air is prevented as the openings 84a are decreased. In actuality, many openings 84a are formed. Note that the shape of each opening 84a is not limited to a square and may be an elongated rectangle or a circle. The openings 84a may be also arranged in a staggered pattern. Preferably, openings 84a are each circular and arranged in a staggered pattern.

Note that although not illustrated in FIG. 10, a rectangular reference electrode 82 is formed below the lower electrode 83.

Figure 11:
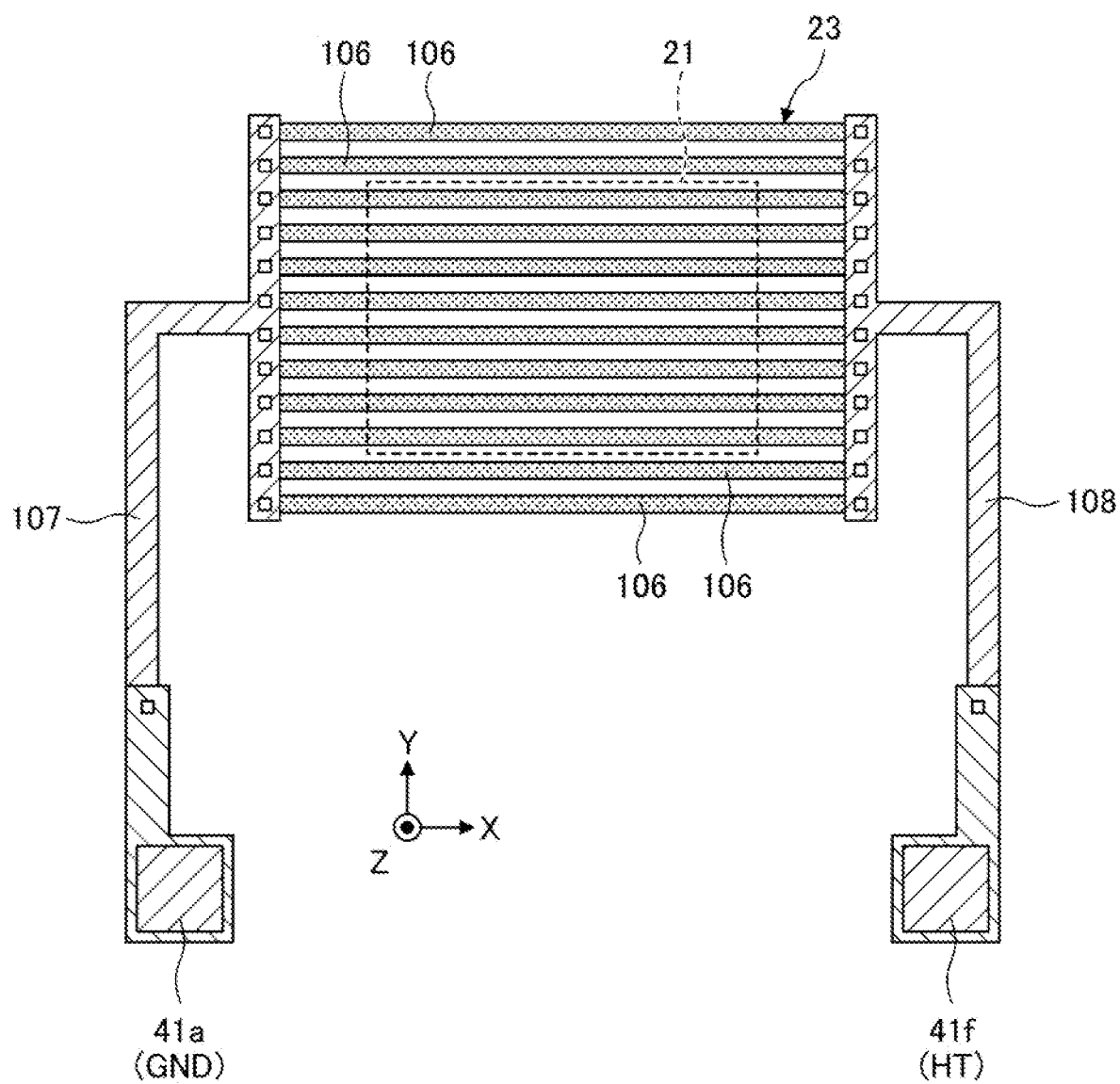
FIG. 11 is a plan view illustrating an example of the shape of n-diffusion layers that constitute a heater.

FIG. 11 is a plan view illustrating an example of the shape of the n-diffusion layers that constitute the heater. As illustrated in FIG. 11, the n-diffusion layers 106 are arranged in a one-dimensional grid shape in which a plurality of elongated, rectangular regions are arranged parallel to each other. One end of each of the n-diffusion layers 106 in the one-dimensional grid shape is connected to the above-mentioned interconnect 107, and another end is connected to the interconnect 108. The heater 23 is positioned below the humidity detector 21 so as to cover the entire humidity detector 21.

[Metal Oxide Film]

Hereafter, a technical significance of forming the metal oxide film 113 between the third insulating film 112 and the moisture sensitive film 86 will be described. In this description, the third insulating film 112 is silicon dioxide ($SiO_2$), and the moisture sensitive film 86 is a polyimide film.

For example, if any layer is not provided between the third insulating film 112 and the moisture sensitive film 86, and a structure in which the third insulating film 112 comes into direct contact with the moisture sensitive film 86 is used, adhesion between the third insulating film 112 and the moisture sensitive film 86 would not be provided sufficiently. From this viewpoints, preferably, any adhesive layer is formed between the third insulating film 112 and the moisture sensitive film 86.

Figure 12:
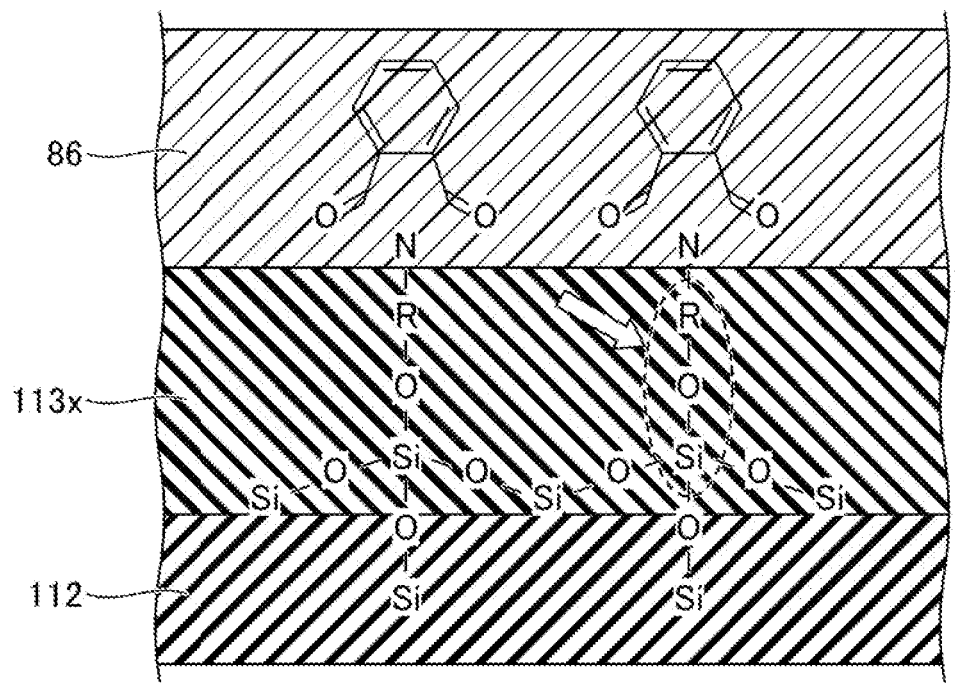
FIG. 12 is a diagram (first part) for describing adhesion between an insulating film and a sensitive moisture film.

For example, as illustrated in a comparative example in FIG. 12, unlike the present embodiment, as a layer that is not a metal oxide film, a case where a silane coupling agent 113x of which a basic skeleton is Si—(OR)x (R=hydrocarbon group, where x=1 to 3) is formed between the third insulating film 112 and the moisture sensitive film 86, is considered.

The silane coupling agent 113x causes the third insulating film 112 ($SiO_2$) to be chemically bonded to the moisture sensitive film 86 (polyimide film), thereby providing sufficient adhesion between the third insulating film 112 and the moisture sensitive film 86 at room temperature. However, at high temperature and high humidity, hydrolysis of Si—O bonds breaks chemical bonds, resulting in film peeling. Consequently, adhesion is not provided. A portion represented by a dotted circle and an arrow in FIG. 12 schematically indicates a state in which chemical bonds are broken.

In contrast, as in the present embodiment described in FIG. 1.3, a case where, for example, alumina ($Al_2O_3$) as the metal oxide film 113 is disposed between the third insulating film 112 and the moisture sensitive film 86, is considered. In this case as well, the alumina ($Al_2O_3$) causes the third insulating film 112 ($SiO_2$) to be chemically bonded to the moisture sensitive film 86 (polyimide film) to thereby provide adhesion between the third insulating film 112 and the moisture sensitive film 86.

The alumina ($Al_2O_3$) is a layer having hydrolysis resistance and can interact chemically with polyimide. Thus, hydrolysis does not take place even at high temperature and high humidity, thereby enabling adhesion between the third insulating film 112 ($SiO_2$) and the moisture sensitive film 86 (polyimide film) to be ensured. A dashed line in a dashed circle represented in FIG. 13 schematically indicates a state in which chemical bonds are formed without breaking any chemical bond.

Figure 13:
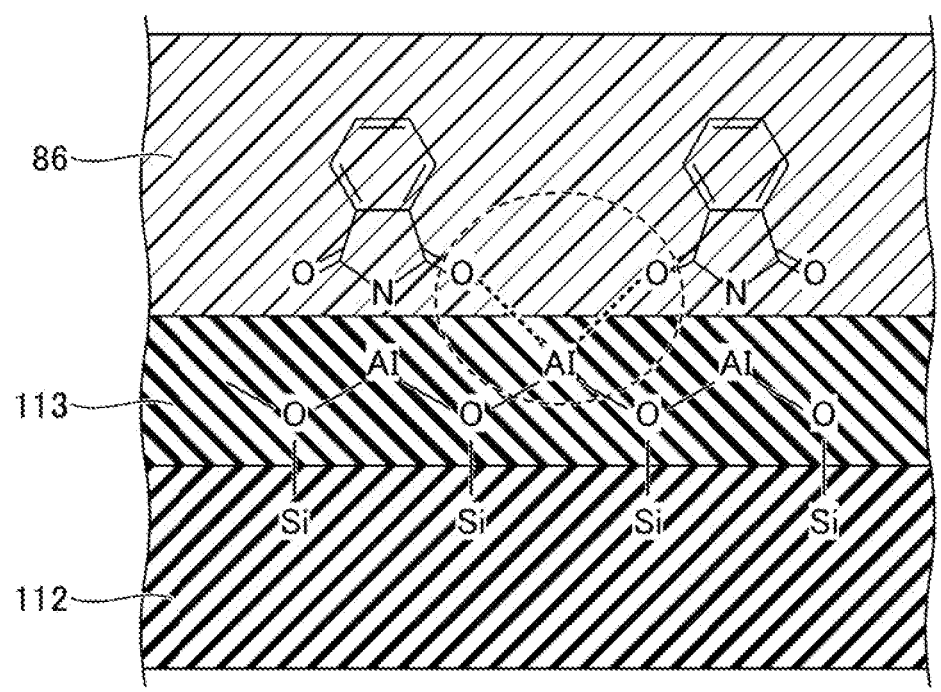
FIG. 13 is a diagram (second part) for describing adhesion between the insulating film and the sensitive moisture film.

Note that the description in FIGS. 12 and 13 is applicable to not only a case where the third insulating film 112 is silicon dioxide and the moisture sensitive film 86 is a polyimide film, but also a case where, for example, the third insulating film 112 is silicon nitride and the moisture sensitive film 86 is an organic resin film other than the polyimide film.

In other words, a material capable of interacting chemically with the moisture sensitive film 86 may be selected as the metal oxide film 113. Aside from alumina ($Al_2O_3$), as such a material, zirconium oxide, titanium oxide, or the like is used.

As described above, in the humidity sensor 10, the metal oxide film 113 is disposed between the third insulating film 112 and the moisture sensitive film 86, so that adhesion between the third insulating film 112 and the moisture sensitive film 86 can be improved even at high temperature and high humidity. That is, reliability characteristics of the humidity sensor 10 can be improved.

The preferred embodiments have been described above in detail. However, various modifications and substitutions to the above-mentioned embodiments can be made without departing from a scope in the present disclosure.

For example, in the embodiments, the reference electrode 82 is disposed above the heater 23. However, the reference electrode 82 may not be situated above the heater 23.

In the embodiments, the p-semiconductor substrate 70 is used as a semiconductor substrate for forming the sensor chip 20. However, an n-semiconductor substrate can be used. In this case, the heater 23 may be formed by one or more p-diffusion layers. In other words, the heater may be formed of an impurity diffusion layer in which an impurity is added to a surface layer of the semiconductor substrate.

In the embodiments, the temperature detector 22 is configured by one or more npn bipolar transistors 90, but may be configured by one or more pnp bipolar transistors. Further, instead of the bipolar transistor, the temperature detector 22 may be configured by one or more pn junction diodes.

The temperature detector 22 may be a temperature sensor other than a band gap type, where the temperature sensor has a pn junction. For example, the temperature detector 22 may be a resistance temperature sensor that detects temperature based on temperature dependence of a resistance value, where an impurity diffusion layer (n-diffusion layer or p-diffusion layer) is used as a resistor.

For the humidity sensor 10, a structure of electrodes used for moisture detection may have a comb tooth shape. In such a structure having the comb tooth shape, a pair of opposing comb tooth electrodes is provided on the same plane of the structure, a protective layer is formed on the pair of comb tooth electrodes, and a moisture sensitive film is formed on the protective film. In this case as well, a metal oxide film such as alumina ($Al_2O_3$) is formed between the protective film and the moisture sensitive film, thereby obtaining the same effect as described above.

The pads 41a to 41f may be disposed only on one side among opposite sides of the sensor chip 20.

What is claimed is:

1. A humidity sensor comprising:
   a semiconductor substrate;
   an insulating film;
   an interconnect layer formed above the semiconductor substrate via the insulating film;
   a protective film that covers the interconnect layer, the protective film being formed of silicon dioxide ($SiO_2$) or silicon nitride (SiN);
   a moisture sensitive film formed above the protective film, the moisture sensitive film being formed of an organic resin film or polyimide; and
   a metal oxide film having
      a first surface on which the protective film is laminated directly, and
      a second surface on which the moisture sensitive film is laminated directly.

2. The humidity sensor according to claim 1, wherein the metal oxide film is formed of $Al_2O_3$.

3. The humidity sensor according to claim 1, further comprising a lower electrode that constitutes part of the interconnect layer; and
   an upper electrode formed on the moisture sensitive film,
      wherein the moisture sensitive film is formed above the lower electrode, and
      wherein each of the protective film and the metal oxide film are disposed between the moisture sensitive film and the lower electrode.

4. The humidity sensor according to claim 3, further comprising a second insulating film different from the insulating film; and
   a reference electrode formed above the semiconductor substrate via the second insulating film,
      wherein the lower electrode and the upper electrode constitute a moisture detection capacitor, and
      wherein the lower electrode and the reference electrode constitute a reference capacitor.

5. The humidity sensor according to claim 1, wherein the semiconductor substrate includes an impurity diffusion layer, and wherein the impurity diffusion layer constitutes a heater.

6. The humidity sensor according to claim 5, further comprising a temperature detector formed in the semiconductor substrate.

* * * * *